United States Patent [19]

Kraft et al.

[11] 3,900,746

[45] Aug. 19, 1975

[54] VOLTAGE LEVEL CONVERSION CIRCUIT

[75] Inventors: Wayne R. Kraft; Robert P. Lowden, both of Wappingers Falls, N.Y.

[73] Assignee: International Business Machines Corporation, Armonk, N.Y.

[22] Filed: May 3, 1974

[21] Appl. No.: 466,562

[52] U.S. Cl. ........... 307/264; 307/214; 307/DIG. 1; 330/3; 330/13

[51] Int. Cl.$^2$.... H03F 3/16; H03F 3/18; H03K 3/14

[58] Field of Search ........... 307/205, 214, 208, 251, 307/264, 279, DIG. 1; 330/3, 13, 15

[56] References Cited

UNITED STATES PATENTS

| | | | |
|---|---|---|---|
| 3,400,335 | 9/1968 | Orchard et al. | 330/3 UX |
| 3,566,145 | 2/1971 | Goodale | 330/13 X |
| 3,573,507 | 4/1971 | Eng | 307/279 |
| 3,631,528 | 12/1971 | Green | 307/251 |
| 3,649,843 | 3/1972 | Redwine et al. | 307/205 X |
| 3,662,188 | 5/1972 | Williams | 307/208 X |
| 3,708,689 | 1/1973 | Lattin | 307/205 |
| 3,739,194 | 6/1973 | Freeman et al. | 307/214 |
| 3,742,252 | 6/1973 | Brzostek | 307/246 |
| 3,801,831 | 4/1974 | Dame | 307/251 |
| 3,823,330 | 7/1974 | Rapp | 307/205 X |

OTHER PUBLICATIONS

Lohman, "Applications of MOS FET's in Microelectronics," SCP & Solid State Technology, 3/1966, pp. 23–29.

Porter, "High Speed Interface Circuits for Driving MOS from TTL," EEN (pub.), 4/1972, pp. 41–43.

*Primary Examiner*—Michael J. Lynch
*Assistant Examiner*—Larry N. Anagnos
*Attorney, Agent, or Firm*—Thomas F. Galvin

[57] ABSTRACT

An interface circuit utilizing bipolar and complementary field effect transistors for interfacing low voltage circuits with higher voltage circuits. The circuit input at the lower voltage level comprises a bipolar transistor connected as an emitter follower. The circuit output is a FET inverter having its input connected to the collector of the bipolar transistor. A divertable current sink in the form of a third FET is connected in series with the inverter and to the emitter of the bipolar transistor.

11 Claims, 3 Drawing Figures

VOLTAGE LEVEL CONVERSION CIRCUIT

BACKGROUND OF THE INVENTION

1. Field of the Invention

This invention relates to voltage level shifting circuits. In particular, it relates to an improved interface for converting the voltage magnitudes of logic levels of one system to different magnitudes required by another system.

2. Description of the Prior Art

In present-day semiconductor integrated circuit technology, many electronic systems and circuits require an interface circuit for shifting the voltage levels developed by one type of logic system to other magnitudes suitable for driving other types of logic systems. Such circuits are also known as voltage level shifting circuits or buffer circuits. Thus, interface circuits are required for interfacing emitter coupled logic (ECL) or transistor-transistor logic ($T^2L$) with metal-oxide-semiconductor field effect transistor (MOSFET) circuits. In these operations input voltage levels from either a $T^2L$ or ECL circuit at from 0 to 1.5 volts are converted to MOS signals having an amplitude of from 0 to around 8.5 volts.

For example, to drive high capacitance lines at high speeds in modern day computer systems requires a substantial amount of power if the signal is large. The power dissipated is a function of the capacitance, voltage level and frequency (power $= C.V^2.f$). It is generally recognized in the art that transmitting a large signal for any distance in a machine cannot be tolerated. Thus, the art has considered the alternative of transmitting a low voltage signal, such as that used in bipolar logic ($T^2L$, ECL, etc.). This approach requires a lower power, fast receiver.

There are numerous other applications where it is necessary to provide an interface between low voltage and high voltage circuits. For example, the newest type of electronic watches drive liquid crystal elements, which require a potential of around 15 volts across the elements from a 1.5 to 3.0 volt battery.

SUMMARY OF THE INVENTION

It is an object of this invention to provide an improved interface circuit for converting the voltage magnitudes of logic levels of one system to different magnitudes required by another logic system.

It is the further object of this invention, in particular, to improve the interfacing circuitry between voltage levels typical of ECL or $T^2$ L families to voltage levels typical of metal-oxide-silicon field effect transistors (MOS FETS).

It is yet another object of this invention to provide an interface circuit which has high speed and low power dissipation as compared to prior art interface circuits.

These and other objects and advantages are achieved in a voltage level conversion circuit in which the circuit input comprises a bipolar transistor connected as an emitter follower and the circuit output is an FET inverter having its input connected to the collector of the bipolar transistor. A third FET is connected in series with the inverter and to the emitter of the bipolar transistor to function as a divertable current sink. The circuit also features resistance means, preferably a field effect transistor functioning as an active load device, connected between the high valued reference potential and the collector of the bipolar transistor.

DESCRIPTION OF THE PREFERRED EMBODIMENT

Figure 1:
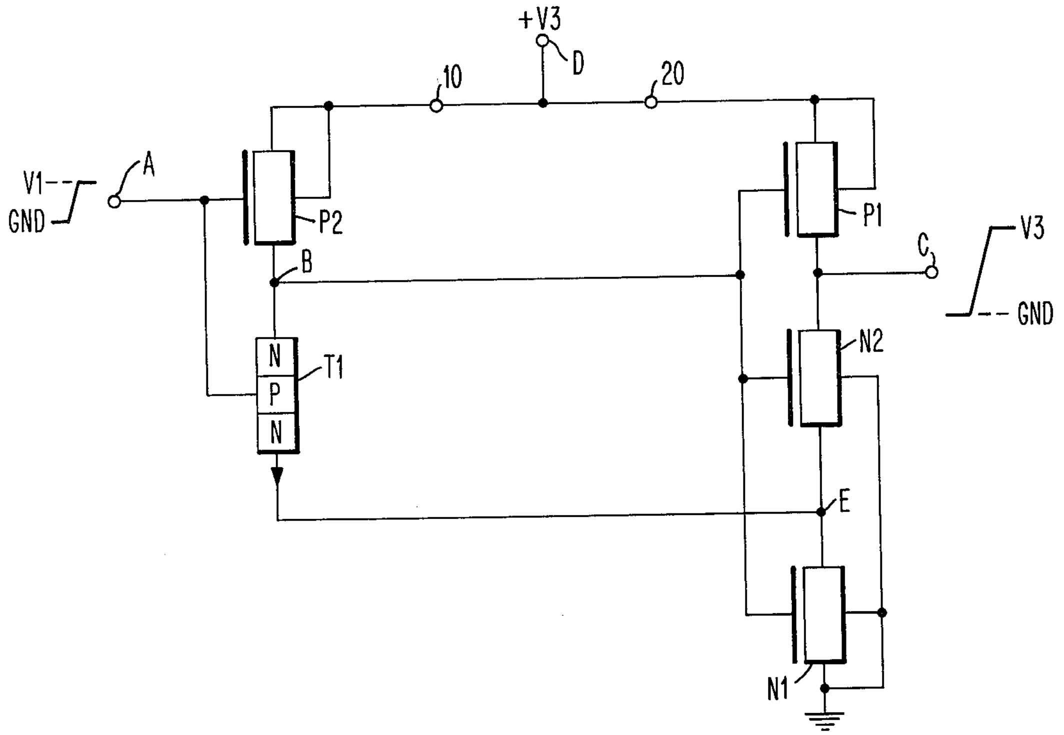
FIG. 1 is a circuit diagram illustrating the interface circuit of our invention.

Referring to the drawings, in FIG. 1 the novel interface circuit comprises a NPN bipolar transistor T1 having an input terminal A connected at its base. The input signal at node A varies between a first reference potential, in this case ground potential, and a second voltage V1. V1 is a relatively low voltage compared to the others to be described. The input signal is also connected to the gate electrode of a P-channel transistor P2. The drain of transistor P2 is connected at node B to the collector of transistor T1. P2 functions as an active load device for T1. The source connection of transistor P2 is connected to a second reference potential V3 at terminal D. In FIG. 1 potential V3 is a high voltage signal which is characteristic of field effect transistor output signals, typically 8.0 volts.

The output node B from bipolar transistor T1 is connected to the gates of field effect transistors P1 and N2. These devices are connected as a standard complementary FET inverter, having an output terminal C at their common drain connection. The emitter terminal of transistor T1 is connected to the drain terminal at node E of N-channel field effect transistor N1, which also forms a series connection with the field effect transistor inverter.

As will be described in more detail, transistor N1 functions as a current path both for the emitter current of bipolar transistor T1 when T1 is conductive and also as a means for returning output node C to ground when T1 is rendered nonconductive. N1 is a variable current sink, the value of the current pulled down being dependent on the potential at its gate.

To further improve the circuit response, transistors N1 and N2 are designed to have a high channel width-to-length ratio, thereby increasing their transconductance.

OPERATION OF THE CIRCUIT

Figure 2:
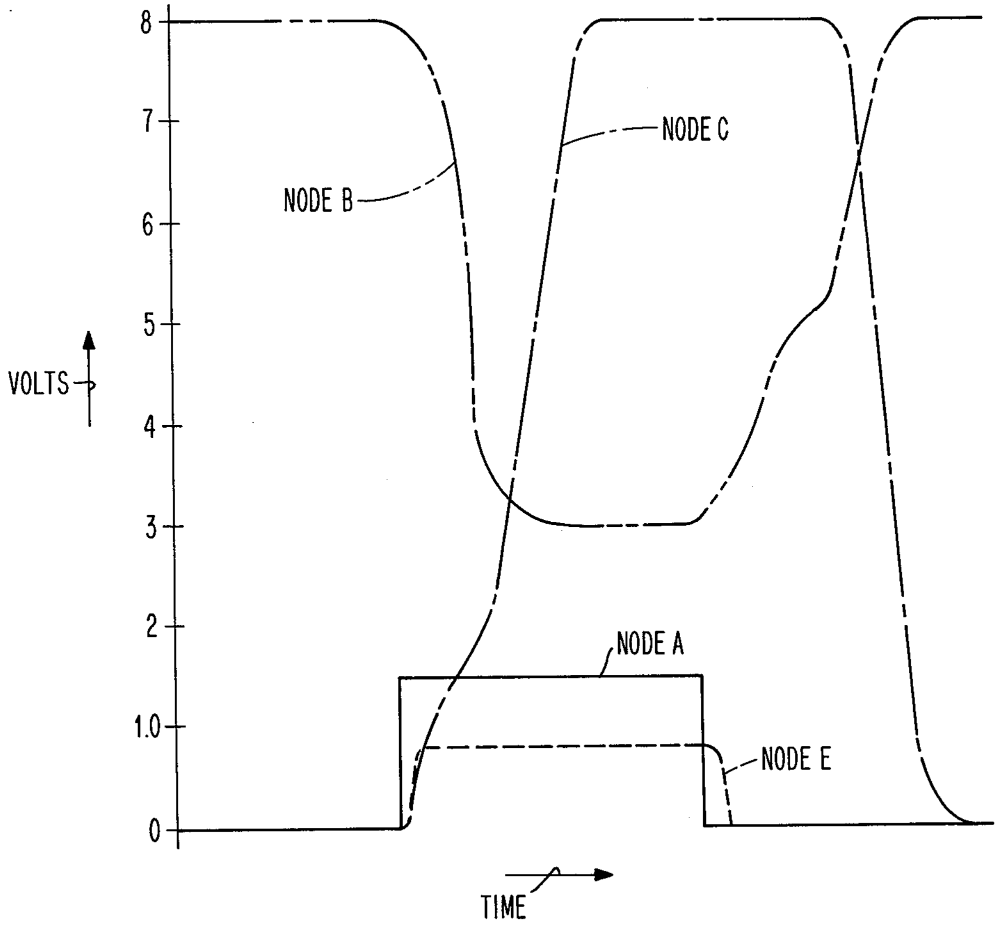
FIG. 2 is a timing diagram of signals at elected nodes of the circuit in FIG. 1.

The operation of the interface circuit of FIG. 1 can best be explained by referring to the timing diagram of FIG. 2 in conjunction with FIG. 1. To present a clear understanding of the invention, the diagram is in terms of typical voltages at the various nodes. It will be understood, however, that out invention is in no way limited to the values used.

When the potential at node A is at ground potential (0 volts) at $t_o$, bipolar transistor T1 is off and field effect transistor P2 is on. With device P2 on and bipolar transistor T1 off, the potential at node B is substantially the same as that at node D, i.e., V3; in the diagram V3 = 8.0 volts. This is sufficient to render N-channel transistors N2 and N1 conductive while maintaining P-channel transistor P1 nonconductive. In this condition, output terminal C is at ground potential through the low resistance path formed by devices N2 and N1 to ground (0 volts).

When the signal at node A rises from ground potential to V1 (1.5 volts) at $t_0$, bipolar transistor T1 turns on, as this is sufficient base bias for current to flow from the collector to emitter of T1. P-channel transistor P2 remains conductive, as potential V1 is not high enough to turn P2 off. Thus, a current path is formed from node D through transistors P2 and T1 to node E. The potential at node E rises from ground to V1 − $V_{BE}$ (T1 base-to-emitter voltage drop). V1 − $V_{BE}$ = 0.8 volts.

This potential rises very quickly as shown in the diagram. As a result, the voltage at node E is temporarily higher than the ground potential at output node C. Since the potential at node B is still high, current is drawn from node E to node C. This action offers a small but significant improvement in the speed with which node C is brought up from ground potential to V3. When the potential at node B reaches about 7 volts, transistor N2 quickly turns off because of the reduction in its gate-to-source voltage and its threshold voltage.

At the same time, the voltage at node E tends to hold device N1 on in combination with the gate voltage at node B. At this point, bipolar transistor T1 is operating in the emitter-follower mode and the potential at node B starts to drop quickly from 8.0 volts to 3.0 volts. The reduced potential at node B then limits current drawn in N-channel transistor N1. Device P1 then turns on fully, thereby bringing the output at terminal C up to +V3, 8.0 volts.

During the next phase of operation, when the potential at terminal A drops from +V1 to ground, bipolar transistor T1 turns off. However, field effect transistor P2 remains on, at an increased current level. The current through P2 from node D to node B is available to charge node B to approximately the potential at terminal D, +V3. This potential is sufficient to turn P1 off and to turn both N-channel devices N1 and N2 on. This action pulls the output at terminal C back to ground very quickly.

From the description just given, it will be apparent that N-channel device N1 functions as a divertable current sink, with the value of current pulled down through the circuit to the ground potential depending on its gate voltage.

With T1 off, the combination of N1 and N2 hold output terminal C at ground level. As T1 is turned on, device N1 provides a low resistance path for T1 to ground. This creates a feed-forward effect so that node E temporarily is raised to a higher potential than node C. As previously noted, this offers a significant improvement in the rise time of the pulse at C. In addition, node B is pulled down from around 8 volts to 3 volts. This combination of a change in both threshold voltage and also gate-to-source voltage of N2 turns N2 off rapidly, causing the voltage at node C to rise to 8 volts rapidly.

Figure 3:
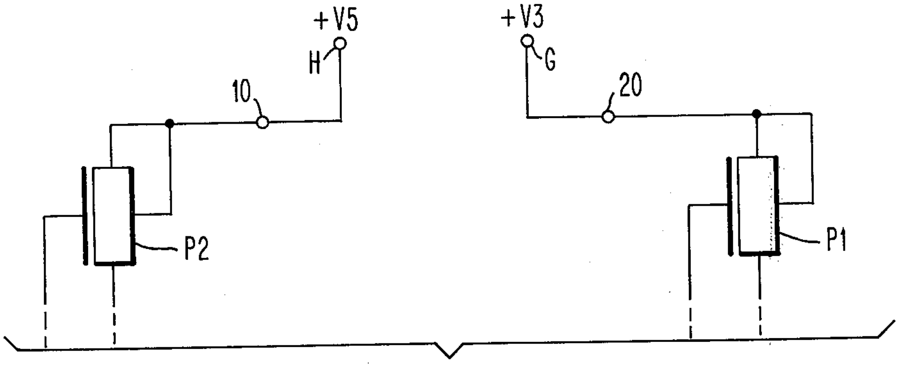
FIG. 3 is an alternate embodiment of the invention.

FIG. 3 is an alternate embodiment of our invention wherein a pair of potential sources at terminals G and H are substituted for the single source at terminal D in FIG. 1. Thus, the only difference between the circuit in FIGS. 1 and 2 is that the single potential V3 on the sources of devices P2 and P1 is replaced by separate potentials V3 and V5 applied to the sources of devices P1 and P2, respectively. The connections are conveniently made at nodes 10 and 20.

The circuit of FIG. 3 offers the advantage of reducing the power dissipated in the circuit when the input potential is at V1. Since the path through P2, transistor T1 and transistor N1 is the only one between the two reference potentials, it is by far the largest power dissipation path in the circuit. Thus, if there is available a lower source of potential to the circuit device, the power dissipation can be lessened by substituting a lower reference potential V5 at the source terminal of P2 while retaining the desired output reference potential +V3 at the source of device P1. For example, assuming that the threshold voltage of P2 is less than 3 volts, potential V5 may be around 4.0 volts while potential V3 is at 8.0 volts. The lower potential V5 is sufficient to maintain satisfactory operation of the circuit while eliminating the power dissipation through the aforementioned high power path. This is accomplished with a slight increase in DC power through path P1, N2 and N1.

While the invention has been particularly shown and described with reference to preferred embodiments thereof, it will be understood by those skilled in the art that the foregoing and other changes in form and detailment be made therein without departing from the spirit and scope of the invention. For example, the preferred embodiment has utilized an NPN bipolar transistor. However, it is to be understood that the invention is equally applicable to PNP bipolar transistors with appropriate changes in the channel type of the field effect transistors and the polarity of the reference potentials. In addition, the resistance means at the collector of bipolar transistor T1 has been shown as a field effect transistor. However, other resistive means could be utilized as well. As previously mentioned, it is desirable that both transistors N1 and N2 have a high W/L ratio (gate width to length) to increase the transconductance of the devices.

We claim:

1. A voltage level translating circuit providing at its output terminal a signal having a voltage level within a first predetermined range in response to a signal at its input terminal having a voltage level within a second predetermined range comprising:

first and second reference potentials;

a bipolar transistor, said input signal being applied to the base of said bipolar transistor; a complementary field effect transistor inverter means including a first field effect transistor of a first channel type and a second field effect transistor of a second channel type complementary to said first channel type; said complementary field effect transistor inverter means connected to said first reference potential for generating said output signal, the gate electrodes of the complementary field effect transistors of said inverter means being connected to the collector of said bipolar transistor;

resistance means connected between the collector of said bipolar transistor and said first reference potential; and variable current sink means connected to the emitter of said bipolar transistor and to said inverter means and being responsive to the voltage level at the collector of said bipolar transistor for holding said output terminal at said second reference potential when the bipolar transistor is non-conductive and for operating said bipolar transistor in the emitter-follower mode when said bipolar transistor is conductive.

2. A voltage level translating circuit as in claim 1 wherein said current sink means is a third field effect transistor connected in series with said inverter means.

3. A voltage level translating circuit as in claim 2 wherein the transconductance of said third field effect transistor and the field effect transistor of said complementary inverter which is of the same channel type as said third transistor is larger than the transconductance of the other field effect transistor in said complementary inverter.

4. A voltage level translating circuit as in claim 1 wherein said resistance means is an active load device.

5. A voltage level translating circuit as in claim 4 wherein said active load device comprises a third field effect transistor having a gate electrode connected to the base of said bipolar transistor.

6. A voltage level translating circuit providing at its output terminal a signal having a voltage level within a first predetermined range in response to a signal at its input terminal having a voltage level within a second predetermined range comprising:

a first field effect transistor, a bipolar transistor and a second effect field effect transistor of opposite channel type to said first field effect transistor connected in series relationship between first and second reference potentials, said input signal being applied to the base of said bipolar transistor and the gate of said first field effect transistor; inverter means comprising complementary field effect transistors for generating said output signal, and connected in series relationship with said second field effect transistor between said first and second reference potentials;

the gate electrodes of the complementary field effect transistors and said second field effect transistor being connected to the collector of said bipolar transistor.

7. A voltage level translating circuit providing at its output terminal a signal having a voltage level within a first predetermined range in response to a signal at its input terminal having a voltage level within a second predetermined range comprising:

first, second and third reference potentials, the magnitude of said first reference potential being greater than that of said third reference potential;

a bipolar transistor, said input signal being applied to its base;

inverter means comprising complementary field effect transistors and connected to said first reference potential for generating said output signal, the gate electrodes of the complementary field effect transistors being connected to the collector of said bipolar transistor;

resistance means connected between the collector of said bipolar transistor and said third reference potential; and variable current sink means connected to the emitter of said bipolar transistor and to said inverter means and being responsive to the voltage level at the collector of said bipolar transistor for holding said output terminal at said second reference potential when the bipolar transistor is non-conductive and for operating said bipolar transistor in the emitter-follower mode when said bipolar transistor is conductive.

8. An interface circuit comprising: first, second and third means for supplying reference potentials;

a bipolar transistor with its base as the input of said interface circuit;

a complementary field effect transistor inverter including a first field effect transistor and a second field effect transistor of a channel type complementary to that of said first field effect transistor and providing the output of said interface circuit;

a third field effect transistor connected in series with said inverter between said first and second reference potential supplying means;

the gate electrodes of said first, second and third field effect transistors being connected to the collector of said bipolar transistor;

the emitter of said bipolar transistor being connected to the common terminal of said inverter and said third transistor; and resistance means connected between said collector and said third reference potential supplying means.

9. An interface circuit as in claim 8 wherein said first and third means for supplying a reference potential are commonly connected.

10. An interface circuit as in claim 9 wherein said active load device comprises a fourth field effect transistor of opposite channel type to said third field effect transistor having a gate electrode connected to the base of said bipolar transistor.

11. An interface circuit as in claim 8 wherein said resistance means is an active load device.

* * * * *